United States Patent
Sangle et al.

(10) Patent No.: US 11,489,105 B2
(45) Date of Patent: Nov. 1, 2022

(54) PHYSICAL VAPOR DEPOSITION OF PIEZOELECTRIC FILMS

(71) Applicant: Applied Materials, Inc, Santa Clara, CA (US)

(72) Inventors: Abhijeet Laxman Sangle, Maharashtra (IN); Vijay Bhan Sharma, Rajasthan (IN); Ankur Kadam, Maharashtra (ID); Bharatwaj Ramakrishnan, San Jose, CA (US); Visweswaren Sivaramakrishnan, Cupertino, CA (US); Yuan Xue, Xi'an (CN)

(73) Assignee: Applied Materials, Inc., Santa Clara, CA (US)

( * ) Notice: Subject to any disclaimer, the term of this patent is extended or adjusted under 35 U.S.C. 154(b) by 49 days.

(21) Appl. No.: 16/691,569

(22) Filed: Nov. 21, 2019

(65) Prior Publication Data

US 2021/0143319 A1    May 13, 2021

(30) Foreign Application Priority Data

Nov. 12, 2019  (CN) .......................... 201911100759.6

(51) Int. Cl.
*C23C 14/35* (2006.01)
*H01L 41/319* (2013.01)
(Continued)

(52) U.S. Cl.
CPC ............ *H01L 41/319* (2013.01); *C23C 14/06* (2013.01); *C23C 14/351* (2013.01); *C23C 14/54* (2013.01);
(Continued)

(58) Field of Classification Search
None
See application file for complete search history.

(56) References Cited

U.S. PATENT DOCUMENTS 5,077,270 A * 12/1991 Takeda .................. C30B 29/225
                                                    505/237
5,338,999 A * 8/1994 Ramakrishnan .... H01L 41/1876
                                                    310/311
(Continued)

FOREIGN PATENT DOCUMENTS

CN         1811008       8/2006
TW          480529       3/2002
(Continued)

OTHER PUBLICATIONS

PCT International Search Report and Written Opinion in International Appln. No. PCT/US2020/059853, dated Feb. 26, 2021, 9 pages.
(Continued)

*Primary Examiner* — Jason Berman
(74) *Attorney, Agent, or Firm* — Fish & Richardson P.C.

(57) ABSTRACT

A method of fabricating a piezoelectric layer includes depositing a piezoelectric material onto a substrate in a first crystallographic phase by physical vapor deposition while the substrate remains at a temperature below 400° C., and thermally annealing the substrate at a temperature above 500° C. to convert the piezoelectric material to a second crystallographic phase. The physical vapor deposition includes sputtering from a target in a plasma deposition chamber.

16 Claims, 3 Drawing Sheets

(51) Int. Cl.
*H01L 41/047* (2006.01)
*H01L 41/08* (2006.01)
*H01L 41/316* (2013.01)
*C23C 14/06* (2006.01)
*C23C 14/54* (2006.01)
*H01L 41/187* (2006.01)

(52) U.S. Cl.
CPC ...... *H01L 41/0477* (2013.01); *H01L 41/0815* (2013.01); *H01L 41/1875* (2013.01); *H01L 41/316* (2013.01)

(56) References Cited

U.S. PATENT DOCUMENTS

| | | | |
|---|---|---|---|
| 5,548,475 A * | 8/1996 | Ushikubo | H01G 4/12 257/295 |
| 6,097,133 A * | 8/2000 | Shimada | B41J 2/14233 310/328 |
| 6,287,435 B1 | 9/2001 | Drewery et al. | |
| 6,294,860 B1 | 9/2001 | Shimada et al. | |
| 2007/0002103 A1 | 1/2007 | Wasa et al. | |
| 2007/0046154 A1 | 3/2007 | Ifuku et al. | |
| 2009/0072673 A1 | 3/2009 | Fujii et al. | |
| 2009/0307885 A1 | 12/2009 | Nihei | |
| 2010/0141097 A1 | 6/2010 | Li et al. | |
| 2010/0206713 A1 | 8/2010 | Li et al. | |
| 2010/0206714 A1 | 8/2010 | Li et al. | |
| 2010/0206718 A1 | 8/2010 | Li et al. | |
| 2010/0213795 A1 | 8/2010 | Li et al. | |
| 2012/0206019 A1 | 8/2012 | Noda et al. | |
| 2012/0306322 A1 | 12/2012 | Cueff et al. | |
| 2013/0101750 A1 | 4/2013 | Yang et al. | |
| 2013/0284589 A1 | 10/2013 | Li et al. | |
| 2013/0334930 A1 | 12/2013 | Kang et al. | |
| 2015/0047975 A1 | 2/2015 | West et al. | |
| 2018/0051368 A1 * | 2/2018 | Liu | C23C 14/3485 |

FOREIGN PATENT DOCUMENTS

| | | |
|---|---|---|
| TW | 201510262 | 3/2015 |
| WO | WO 2017/090445 | 6/2017 |

OTHER PUBLICATIONS

Office Action in Taiwanese Appln. No. 109139101, dated Jun. 30, 2021, 14 pages (with English summary).
Office Action in Taiwanese Appln. No. 109139101, dated Feb. 16, 2022, 12 pages (with English summary).
Office Action in Taiwanese Appln. No. 109139101, dated May 17, 2022, 16 pages (with English summary).

* cited by examiner

PHYSICAL VAPOR DEPOSITION OF PIEZOELECTRIC FILMS

TECHNICAL FIELD

This invention relates to fabrication of piezoelectric devices, and more particularly to physical vapor deposition of piezoelectric films.

BACKGROUND

Piezoelectric materials have been used for several decades in a variety of technologies, e.g., ink jet printing, medical ultrasound and gyroscopes. Conventionally, piezoelectric layers are fabricated by producing a piezoelectric material in a bulk crystalline form and then machining the material to a desired thickness, or by using sol-gel techniques to deposit the layer. Lead zirconate titanate (PZT), typically of the form $Pb[Zr_xTi_{1-x}]O_3$, is a commonly used piezoelectric material. Sputtering of PZT has been proposed.

More recently relaxor-lead titanate (relaxor-PT), such as $(1-X)[Pb(Mg_{1/3}Nb_{2/3})O_3]\text{-}X[PbTiO_3]$ (PMN-PT), $(1-X)[Pb(Y_{1/3}Nb_{2/3})O_3]\text{-}X[PbTiO_3]$ (PYN-PT), $(1-X)[Pb(Zr_{1/3}Nb_{2/3})O_3]\text{-}X[PbTiO_3]$ (PZN-PT), $(1-X)[Pb(In_{1/3}Nb_{2/3})O_3]\text{-}X[PbTiO_3]$ (PIN-PT), etc. have been proposed as better piezoelectric materials. Relaxor-PT can offer improved piezoelectric properties over the more commonly used PZT material. However, large area thin film deposition of a relaxor-PT layer in a commercially viable manner has been not yet been demonstrated.

SUMMARY

In one aspect, a method of fabricating a piezoelectric layer includes depositing a piezoelectric material onto a substrate in a first crystallographic phase by physical vapor deposition while the substrate remains at a temperature below 400° C., and thermally annealing the substrate at a temperature above 500° C. to convert the piezoelectric material to a second crystallographic phase. The physical vapor deposition includes sputtering from a target in a plasma deposition chamber.

In another aspect, a physical vapor deposition system includes a deposition chamber, a support to hold a substrate in the deposition chamber, a target in the chamber formed of a piezoelectric material, a power supply configure to apply power to the target to generate a plasma in the chamber to sputter material from the target onto the substrate to form a piezoelectric layer on the substrate, and a controller configured to cause the power supply to alternate between deposition phases in which the power supply applies power to the target and cooling phases in which power supply does not apply power to the target, with each deposition phase lasting at least 30 seconds and each cooling phase lasting at least 30 seconds.

Implementations may have, but are not limited to, one or more of the following advantages.

A device that includes a layer of piezoelectric material can be fabricated using physical vapor deposition in a commercially viable process. Overheating and damage to the target can be reduced, and thus the danger of defects can be reduced and down-time of the processing chamber can be improved. PMNPT can be used for the piezoelectric material, which can provide superior piezoelectric properties. A uniform crystalline phase and stoichiometry can be achieved across the wafer. The process can also limit the presence of parasitic phases such as PbOx and pyrochlore, which can be detrimental to the piezoelectric properties.

The details of one or more embodiments are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

Machining a piezoelectric layer from a bulk crystal and depositing a piezoelectric layer using sol-gel techniques are slow processes that are not conducive to being performed in a semiconductor fabrication plant. Bulk crystals need to be machined in conventional machine shops. This is not only expensive but also limits the ability of the piezoelectric layer to be integrated into devices. Sol-gel processes require multiple rounds of deposition and curing, thus making the process time-consuming. Thus, deposition of a piezoelectric material by a physical vapor deposition process, e.g., sputtering, would be desirable.

Fabrication of thin films of piezoelectric material by physical vapor deposition (PVD) over large area semiconductor wafers, e.g., silicon wafers, has been challenging. For PVD of piezoelectric materials, e.g., PZT or relaxor-PT, the target used in the sputtering process is a ceramic material. However, the target used in the chamber can be subject to cracking or other forms of damage. Moreover, even damage to the target that is not visible can result in the release of particulates, which can cause defects in the piezoelectric layer. being Without being limited to any particular theory, the ceramic materials used for the target have a poor thermal conductivity and, as a result, can accumulate so much heat (either directly due to from power applied by a power source or radiatively from the substrate or both) that the target cracks or is otherwise damaged. Replacement of the target requires down-time for the PVD system, which increases cost-of-ownership.

Hypothetically a cooling system could be used to keep the target at a relatively low temperature. However, in practice the additional cooling required is impractical. As noted above, the ceramic target has poor thermal conductivity and thus limited ability to transfer heat to a cooling medium. While grooves or channels could be formed in the top of the target to increase thermal contact area and thus improve the thermal transfer, such features can introduce non-uniformity in the electric field and the deposition process.

A technique that may address these issues is to deposit the piezoelectric layer while operating the PVD chamber in a manner that keeps the target at a lower temperature, e.g., to apply power at a lower wattage and/or intermittently to permit the target to cool. In addition, the deposition process is followed by thermal annealing of the piezoelectric layer so that the piezoelectric material achieves a desired crystalline structure.

Figure 1:
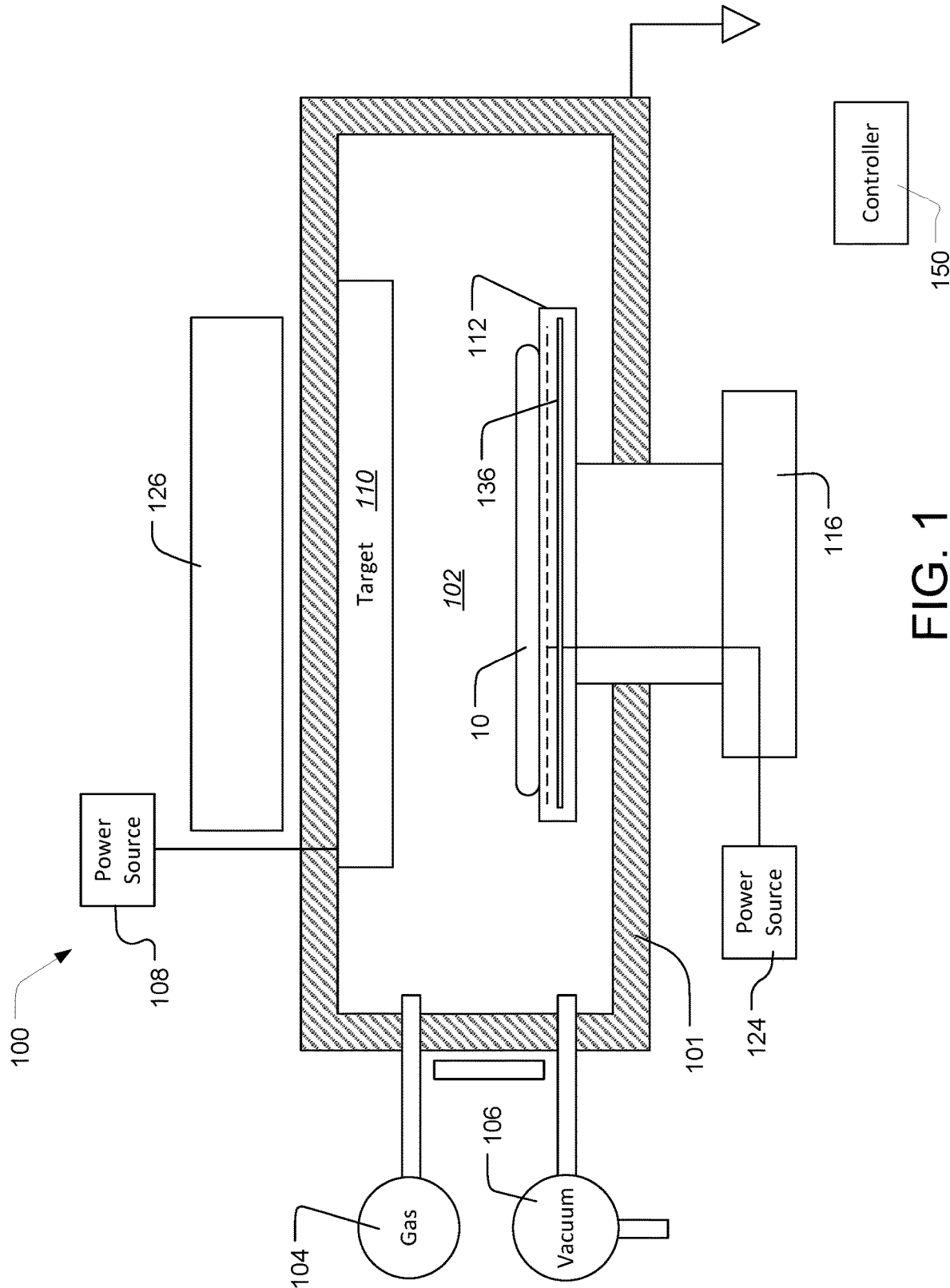
FIG. 1 is a schematic cross-sectional view of a physical vapor deposition processing chamber.

FIG. 1 depicts a schematic representation of a chamber 100 of an integrated processing system, e.g., an ENDURA system, suitable for practicing the physical vapor deposition process discussed below. The processing system can include multiple chambers, which can be adapted for PVD or CVD processes. For example, the processing system can include a cluster of interconnected process chambers, for example, a CVD chamber and a PVD chamber.

The chamber 100 includes chamber walls 101 that surround a vacuum chamber 102, a gas source 104, a pumping system 106 and a target power source 108. Inside the vacuum chamber 102 is a target 110 and a pedestal 112 to support the substrate 10. A shield can be placed inside the chamber to enclose a reaction zone. The pedestal can be vertically movable, and a lift mechanism 116 can be coupled to the pedestal 112 to position the pedestal 112 relative to the target 110. A heater or chiller 136, e.g., a resistive heater or a thermoelectric chiller, can be embedded in the pedestal 112 to maintain the substrate 10 at a desired process temperature.

The target 110 is composed of the material to be deposited, e.g., lead magnesium niobate-lead titanate for PMNPT, or lead zirconate titanate for PZT. However, the target can have an excess of $PbO_x$ relative to the desired stoichiometry for the layer to be deposited to account for the loss of lead due to its volatile nature. For example, the target can have an excess of PbO of 1-20 mol %. The target itself should be of homogenous composition. he target 110 can be platinum (Pt) or Titanium (Ti) for deposition of other layers.

The gas source 104 can introduce an inert gas, e.g., argon (Ar) or xenon (Xe), or a mixture of an inert gas with a processing gas, e.g., oxygen, into the vacuum chamber 102. The chamber pressure is controlled by the pumping system 106. The target power source 108 may include a DC source, a radio frequency (RF) source, or a DC-pulsed source.

In operation, the substrate 10 is supported within the chamber 102 by the pedestal 112, gas from the source 104 flows into the chamber 102, and the target power source 108 applies power to the target 110 at a frequency and voltage to generate a plasma in the chamber 102. The target materials are sputtered from the target 110 by the plasma, and deposited on the substrate 10.

If the target power source 108 is DC or DC-pulsed, then the target 110 acts as a negatively biased cathode and the shield is a grounded anode. For example, a plasma is generated from the inert gas by applying a DC bias to the sputtering target 210 sufficient to generate a power density of about 0.5 to 350 Watts per square inch, e.g., 100-38,000 W for a 13 inch diameter target, and more typically about 100-10,000 W. If the target power source 108 is an RF source, then the shield is typically grounded and the voltage at the target 110 varies relative to the shield at a radio frequency, typically 13.56 MHz. In this case, electrons in the plasma accumulate at the target 110 to create a self-bias voltage that negatively biases the target 110.

The chamber 100 may include additional components for improving the sputtering deposition process. For example, a power source 124 may be coupled to the pedestal 112 for biasing the substrate 10, in order to control the deposition of the film on the substrate 10. The power source 124 is typically an AC source having a frequency of, for example, between about 350 to about 450 kHz. When the bias is applied by the power source 124, a negative DC offset is created (due to electron accumulation) at the substrate 10 and the pedestal 112. The negative bias at the substrate 10 attracts sputtered target material that becomes ionized. The target material is generally attracted to the substrate 10 in a direction that is substantially orthogonal to the substrate 10. As such, the bias power source 124 improves the step coverage of deposited material compared to an unbiased substrate 10.

The chamber 100 may also have a magnet 126 or magnetic sub-assembly positioned behind the target 110 for creating a magnetic field proximate to the target 1210. In some implementations, the magnet rotates during the deposition process.

The operation of the chamber can be controlled by a controller 150, e.g., a dedicated microprocessor, e.g., an ASIC, or a conventional computer system executing a computer program stored in a non-volatile computer readable medium. The controller 150 can include a central processor unit (CPU) and memory containing the associated control software.

Figure 2:
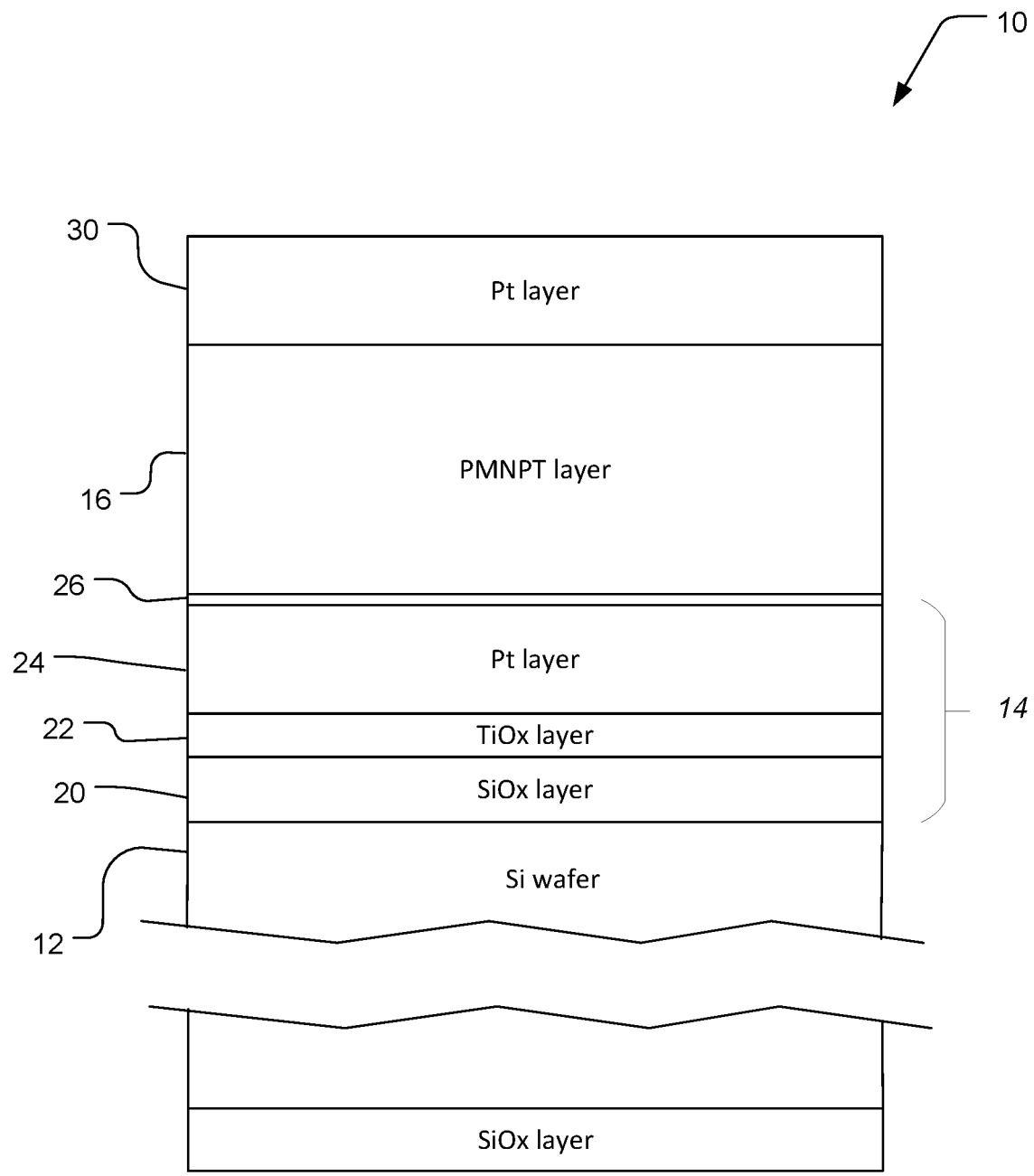
FIG. 2 is a schematic cross-sectional illustration of a stack of layers in a piezoelectric device.

FIG. 2 illustrates a cross-section of a portion of a substrate 10 for fabrication of a device that includes a piezoelectric layer 16 formed on a semiconductor wafer 12. In particular, the substrate 10 includes one or more layers 14 between the semiconductor wafer 12 and the piezoelectric layer 16. The one or more layers 14 include at least a first conductive layer 24 to provide a lower electrode. Depending on the material of the electrode and the piezoelectric material, the one or more layers 14 can also include an adhesion layer 22 to improve adhesion of the conductive layer 24 to the semiconductor wafer 12, and a seed layer 26 promote proper crystalline orientation of the piezoelectric material in the piezoelectric layer 16. For some piezoelectric materials, the adhesion layer 22 and/or the seed layer 26 are not required and can be absent.

The semiconductor wafer can be a silicon wafer, or another semiconductor such as germanium (Ge). The silicon wafer can be a single crystal silicon wafer, and can have a <001> crystallographic orientation, although other orientations can work.

Assuming the adhesion layer 22 and the seed layer 26 are present, the layer stack 14 includes, in order, a silicon oxide (SiOx) layer 20, an adhesion layer 22, the lower conductive layer 24, and the seed layer 26.

The silicon oxide layer 20 can include $SiO_2$, SiO, or a combination thereof. The silicon oxide layer 20 can be a thermal oxide, and can have a thickness of about 50-1000 nm. The silicon oxide layer 20 can be an amorphous layer.

The adhesion layer 22 can be a metal oxide layer. The stoichiometry of the metal oxide layer can $MO_2$, $M_2O_3$, or MO (with M representing the metal element), or another suitable stoichiometry of the metal and oxygen. In particular, the adhesion layer 22 can be formed of titanium oxide, e.g., $TiO_2$, $Ti_2O_3$, TiO, or anther stoichiometry of titanium and oxygen. In some implementations, rather than a metal oxide layer, the adhesion is a pure metal or a metal alloy. Examples for the metal (either for the metal of the metal oxide, or for the pure metal or component of the metal alloy) include titanium, chromium, chromium-nickel, and nickel. The adhesion layer 22 can be thinner than the silicon oxide layer 20. For example, a titanium oxide adhesion layer 22 can have a thickness of 25-40 nm. The adhesion layer 22 can have a crystallographic orientation for facilitating a desired crystallographic orientation of the conductive layer 24. For example, a $TiO_2$ layer can have a <001> orientation to facilitate a <111> orientation in a platinum conductive layer.

The first conductive layer 24 is formed of a conductive material such as platinum, gold, iridium, molybdenum, $SrRuO_3$. The first conductive layer 24 can be thicker than the adhesion layer 22, and can be thicker than the silicon oxide layer 20. For example, the first conductive layer 24 can have a thickness of 50-300 nm. The first conductive layer 24 can have a crystallographic orientation for facilitating a desired crystallographic orientation of the seed layer 26. For example, a platinum layer can have a <111> crystallographic orientation to facilitate a <001> orientation in a titanium oxide seed layer.

The seed layer 26 can be metal oxide. In particular, the seed layer 26 can be an oxide of titanium or niobium. For example, the seed layer can be $TiO_2$, $Ti_2O_3$, TiO, or another stoichiometry of titanium and oxygen. The seed layer 26 should have a uniform stoichiometry across the surface of the substrate 10. The seed layer 26 can have a crystallographic orientation for facilitating a desired crystallographic orientation of the piezoelectric layer 28. For example, a titanium oxide layer can have a <001> crystallographic orientation to facilitate a <001> orientation in a PMNPT piezoelectric layer. The seed layer 26 is thinner than the adhesion layer 22. For example, first seed layer 26 can be about 1-5 nm, thick, e.g., 2 nm.

The piezoelectric layer 16 is formed on the seed layer 26. Examples of material for the piezoelectric layer 16 include PZT and relaxor-PT materials. In particular, the material can be $(1-x)[Pb(Mg_{(1-y)}Nb_y)O_3]-x[PbTiO_3]$, where x is about 0.2 to 0.8, and y is about 0.8 to 0.2, e.g., about ⅔. Due to the presence of the metal oxide seed layer, the PMNPT material can be predominantly, e.g., substantially entirely, a <001> crystallographic orientation. The piezoelectric layer can have a thickness of 50 nm to 10 microns.

A second conductive layer 30 is formed on the piezoelectric layer 16. The second conductive layer 30 can be the same material composition as the first conductive layer 24, and can be the same thickness as the first conductive layer 24. For example, the second conductive layer 30 can be platinum, and can have a thickness of 50-300 nm.

A voltage can be applied between the first and second conductive layers 24, 30 in order to actuate the piezoelectric layer 16. Thus, the first conductive layer provides 24 a lower electrode and the second conductive layer 30 provides an upper electrode with the piezoelectric layer 16 sandwiched therebetween.

To fabricate the layer stack 14, an oxide of $SiO_2$ can be grown on a Si <001> single crystal wafer by thermal processing in an oxygen-containing atmosphere. The thermal oxide can be grown to a thickness of 50-1000 nm, e.g., 100 nm. The thermal oxide can be formed on both sides of the silicon wafer.

If the optional adhesion layer is included, then a metal layer which will provide the metal of the adhesion layer is deposited by PVD. For example, a titanium layer can be deposited. For example, the metal layer can be deposited with the substrate between room temperature and 600° C. and a power density of 0.5 to 20 Watts per square inch, e.g., about 1.5 Watts per square inch, applied to the target. Deposition of the metal layer can be followed by annealing in a rapid thermal processing chamber or furnace in the presence of oxygen or air to form the adhesion layer in the form of the metal oxide layer, e.g., TiOx. The annealing can be at a temperature of 500-800° C., e.g., for 2-30 minutes. The resulting adhesion layer can have a thickness of 5-400 nm.

Next, the first conductive layer is deposited either on the adhesion layer (if present), on the silicon oxide (if present), or directly on the semiconductor wafer. For example, a platinum layer can be deposited at a substrate temperature of room temperature to 500° C., with a power density of 0.5 to 20 Watts per square inch, e.g., 4-5 Watts per square inch, applied to the target. Deposition of the first conductive layer can proceed until the layer has a thickness of 50-300 nm. The adhesion layer, if present, provides improved adhesion between the platinum and the silicon oxide.

If the optional seed layer is included, then a very thin metal layer, e.g., titanium, is deposited on the lower electrode, e.g., the platinum layer, by a PVD (e.g., DC sputtering) or a CVD (e.g., ALD) technique. In particular, a titanium layer can be deposited, e.g., by DC sputtering. For example, the titanium seed layer can be deposited with the substrate at room temperature to 500 C and a power density of 0.5 to 4 Watts per square inch, e.g., 1 Watt per square inch, applied to the target. The thin metal layer can have a thickness of 1-5 nm. The thin metal layer can then be oxidized, e.g., heated in an oxidizing atmosphere to convert the metal layer to a metal oxide, e.g., convert Ti to TiOx, to provide the seed layer. Additionally, the oxidized seed layer can also be deposited directly by a PVD or CVD technique, e.g., TiOx deposition by RF sputtering or ALD.

Next, the piezoelectric layer is deposited, either on the seed layer or directly on the first conductive layer, by PVD. In particular, piezoelectric layer is deposited while keeping the target at a relatively low temperature, e.g., no higher than 175° C., e.g., no higher than 150° C. For example, the target can be kept at room temperature to 150° C. A cooling system in the ceiling of the deposition system can be used to cool the target.

The deposition process can be run with the substrate at a relatively low temperature, e.g., no higher than 350° C., e.g., no higher than 300° C. For example, the cooling system in the pedestal can be operated to keep the substrate at room temperature to 300° C. In contrast, a conventional temperature to deposit a relaxor-PT material is about 600-650° C. While such a high temperature can provide desirable crystalline properties in the piezoelectric material upon deposition, the radiative heat from the substrate can be absorbed by the target, resulting in over-heating of the target.

Power applied to the target can be restricted to less than 1.5 $W/cm^2$, e.g., less than 1.2 $W/cm^2$. For example, for a 13 inch diameter target, the power source can apply about 1000 W power (in contrast a conventional PVD operation would be conducted at 1.5 kW to 5 kW). This lower power level results in less heat being generated in the target.

Figure 3:
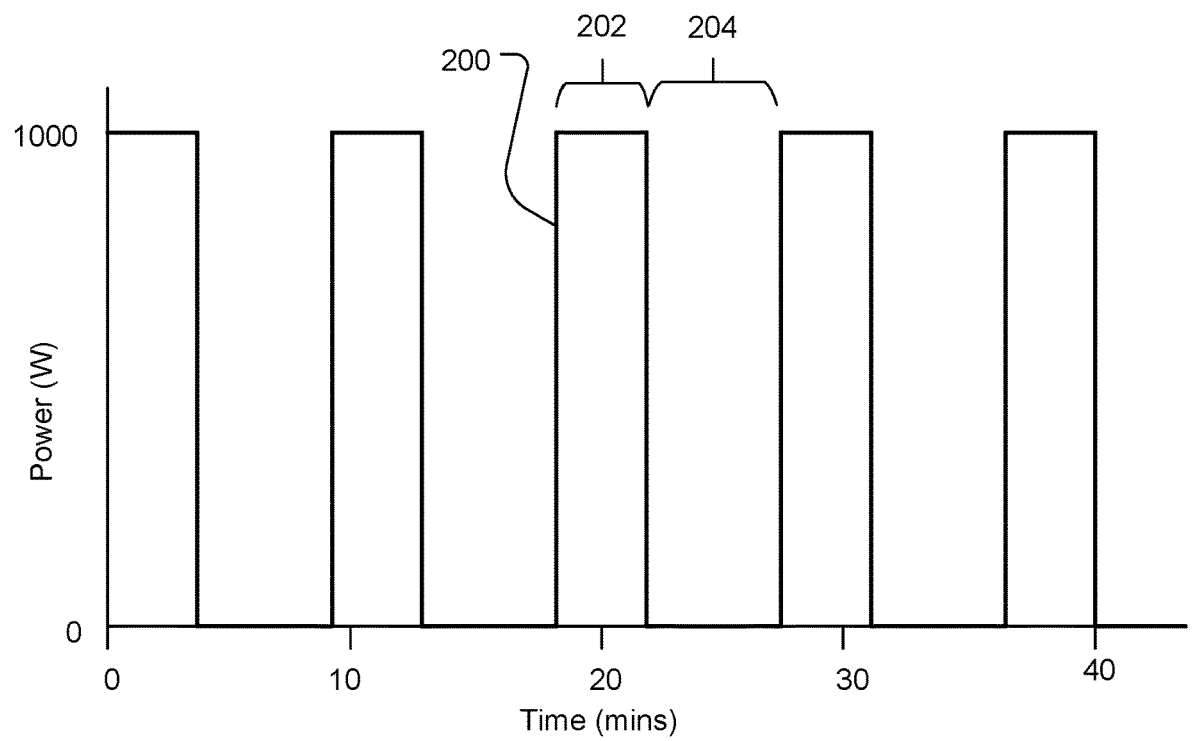
FIG. 3 is a schematic illustration of a timing diagram for application of power to a target in the physical vapor deposition processing chamber.

In addition, system can alternate between deposition phases in which power is applied to the target, and cooling phases in which no power is applied and the target is permitted to cool down. For example, referring to FIG. 3, power is applied in pulses 200 during deposition phases 202, and power is not applied (or is applied at a significantly lower level) during cooling phases 204. The deposition phases 202 and cooling phases 204 can last longer than 15 seconds, e.g., longer than 30 seconds, e.g., longer than a minute. The deposition phases 202 and cooling phases 204 can be up to about 10 minutes long. In some implementations, the cooling phases 204 can last longer than the deposition phases. For example, each deposition phase 202 can last three to five minutes, and each cooling phase 204 can last one to ten minutes, e.g., five to seven minutes. The cooling phases allow the target to cool down between successive deposition steps and can reduce or prevent cracking of the target.

Figure 4:
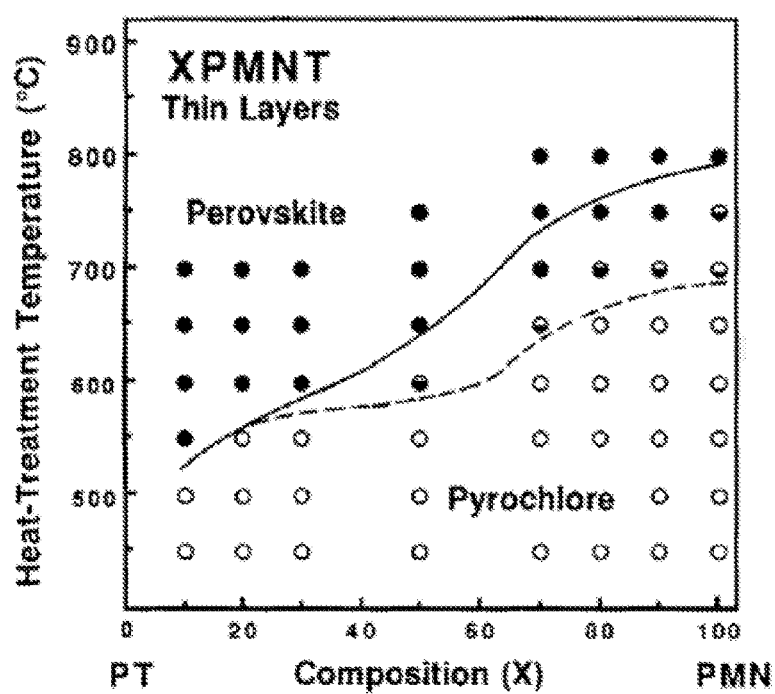
FIG. 4 is a schematic diagram illustrating phase of PMNPT as a function of temperature and composition.

After deposition of the piezoelectric layer, the substrate is removed from the PVD deposition chamber subjected to ex-situ thermal annealing, e.g. in a furnace or rapid thermal processing system. The substrate can be heated to 500-850° C. In particular, for a piezoelectric layer formed of relaxor- PT material, the substrate can be heated to a temperature above the phase transition temperature between the perovskite and pyrochlore phases of the relaxor-PT material. As an example, FIG. 4 illustrates the phase transition temperature as a function of the percentage of PMN in the PMNPT (the percentage of PMN is given by X in the chemical formula $(1-X)[Pb(Mg_{(1-Y)}Nb_Y)O_3]-X[PbTiO_3]$). For example, for a piezoelectric layer that is about 70% PMN and 30% PT, the substrate should be raised to a temperature of about 750° C. or higher.

The temperature of substrate should be raised with sufficient speed to limit formation of piezoelectric crystals in the pyrochlore phase, e.g. to below 50%. For example, the temperature can be raised from room temperature at a rate of 10-50° C. per second until the desired temperature is reached. Without being limited to any particular theory, the energy required for piezoelectric materials such as PMNPT to transition from the pyrochlore phase to the persovskite phase can be greater than the energy required to transition from the amorphous phase to the persovskite phase. Thus, if temperature is raised slowly, the piezoelectric material can enter and become "locked in" the pyrochlore phase. However, if the temperature is raised sufficiently rapidly, the piezoelectric material does not have sufficient time to form crystals in the pyrochlore phase.

The annealing can be conducted in a regular atmosphere, pure oxygen environment, pure nitrogen environment, a mixture of pure oxygen and nitrogen or in vacuum. Presence of oxygen during annealing can affect stoichiometry of the piezoelectric layer.

The annealing can significantly change crystalline grain size. Annealing can also significantly increase the d33 coefficient, e.g., from 42 pm/V to 197 pm/V.

A superior PMNPT layer can be formed with X approximately equal to ⅓ and Y approximately equal to ⅔ in $(1-X)[Pb(Mg_{(1-Y)}Nb_Y)O_3]-X[PbTiO_3]$. For example, X can be about 0.25 to 0.40, and Y can be 0.75 to 0.60. Such a composition can provide a favorable energy landscape at the morphotropic phase boundary (MPB) of PMNPT solid solution phase diagram. Due to the complex stoichiometry of PMNPT material, there is competition between different phases to crystallize because of comparable energies of formation. Thus, these ranges can be critical because slight deviation can determine whether the crystal structure of PMNPT is cubic, orthorhombic, rhombohedral, tetragonal or monoclinic, which in turn can have significant effect on piezoelectric properties.

Finally, a second conductive layer, e.g., a platinum film, is deposited by PVD on the piezoelectric layer. For example, the second platinum film can be deposited under the same conditions as the first platinum film.

A number of embodiments have been described. Nevertheless, it will be understood that various modifications may be made without departing from the spirit and scope of the disclosure. For example, The system 100 illustrated in FIG. 1 is suitable for processing a planar substrate 10, such as a semiconductor substrate, e.g., a silicon wafer, but the techniques discussed below could be adapted to non-planar substrate.

The PVD process can use a self-ionized plasma (SIP). In the SIP process, a plasma is initially ignited using an inert gas such as argon. After plasma ignition, the inert gas flow is terminated, and the deposition plasma is maintained by ions generated from the sputtering target.

The upper electrode could be a different conductive material than the lower electrode, e.g., a conductive material other than platinum.

Although PMNPT and PZT are discussed, the technique of limiting target temperature and thermally annealing the piezoelectric layer can be applied to other piezoelectric compositions, e.g., PYN-PT, PZN-PT, PIN-PT, etc.

Accordingly, other embodiments are within the scope of the following claims.

What is claimed is:

1. A method of fabricating a piezoelectric layer, comprising:
depositing a piezoelectric material onto a substrate in a first crystallographic phase by physical vapor deposition while the substrate remains at a temperature below 400° C., wherein the physical vapor deposition includes sputtering from a target in a plasma deposition chamber;
maintaining the target at a temperature below 150° C. during the physical vapor deposition of the piezoelectric material; and
thermally annealing the substrate at a temperature above 500° C. to convert the piezoelectric material to a second crystallographic phase.

2. The method of claim 1, wherein the second crystallographic phase is a perovskite phase.

3. The method of claim 2, wherein the first crystallographic phase is an amorphous or a quasi-crystalline phase.

4. The method of claim 1, wherein the piezoelectric material is selected from a group consisting of lead magnesium niobate-lead titanate (PMNPT), lead yttrium niobate-lead titanate (PYNPT), lead zirconate titanate (PZT), lead zirconium niobate-lead titanate (PZN-PT), and lead indium niobate-lead titanate (PIN-PT).

5. The method of claim 4, wherein the piezoelectric material is lead magnesium niobate-lead titanate (PMNPT).

6. The method of claim 5, wherein the PMNPT is $(1-X)[Pb(Mg(1-Y)NbY)O3]-X[PbTiO3]$, where X is about 0.25 to 0.40 and Y is about 0.75 to 0.60.

7. The method of claim 6, wherein thermally annealing the substrate comprises thermally annealing the substrate at a temperature of 500-800° C.

8. The method of claim 1, comprising depositing the piezoelectric material to a thickness of 50 nm to 10 microns.

9. The method of claim 1, wherein the physical vapor deposition includes applying power to the target at a power less than 1.5 W/cm2 of the target.

10. The method of claim 1, wherein the physical vapor deposition includes alternating between deposition phases in which power is applied to the target and cooling phases in which power is not applied to the target, each deposition phase lasting at least 30 seconds and each cooling phase lasting at 30 seconds.

11. The method of claim 10, wherein the cooling phases are longer than the deposition phases.

12. The method of claim 10, wherein each deposition phase lasts at most five minutes.

13. The method of claim 10, wherein each deposition phase lasts at most ten minutes.

14. The method of claim 1, comprising maintaining a temperature of the substrate below 400° C. during the physical vapor deposition.

15. The method of claim 1, comprising maintaining a temperature of the substrate by cooling a pedestal in the chamber that supports the substrate with a chiller.

16. A method of fabricating a piezoelectric layer, comprising:

depositing a piezoelectric material composed of lead magnesium niobate-lead titanate (PMNPT) onto a substrate in an amorphous phase by physical vapor deposition while the substrate remains at a temperature below 300° C., wherein the physical vapor deposition includes sputtering from a target in a plasma deposition chamber; and thermally annealing the substrate at a temperature above 500° C. to convert the piezoelectric material to a perovskite phase, wherein the annealing includes raising the temperature of the substrate at a rate sufficient that substantially no pyrochlore phase crystal is formed in the piezoelectric material.

* * * * *